(12) United States Patent
Hahn

(10) Patent No.: US 10,136,520 B2
(45) Date of Patent: Nov. 20, 2018

(54) METHODS OF FORMING A MICROELECTRONIC DEVICE STRUCTURE, AND RELATED MICROELECTRONIC DEVICE STRUCTURES AND MICROELECTRONIC DEVICES

(71) Applicant: Quartzdyne, Inc., Salt Lake City, UT (US)

(72) Inventor: Mark Hahn, South Jordan, UT (US)

(73) Assignee: Quartzdyne, Inc., Salt Lake City, UT (US)

( * ) Notice: Subject to any disclaimer, the term of this patent is extended or adjusted under 35 U.S.C. 154(b) by 0 days.

(21) Appl. No.: 15/641,057

(22) Filed: Jul. 3, 2017

(65) Prior Publication Data

US 2017/0311451 A1    Oct. 26, 2017

Related U.S. Application Data

(62) Division of application No. 14/859,026, filed on Sep. 18, 2015, now Pat. No. 9,717,148.

(51) Int. Cl.
*H01L 23/00* (2006.01)
*H05K 3/10* (2006.01)
(Continued)

(52) U.S. Cl.
CPC ............. *H05K 3/103* (2013.01); *B23K 9/091* (2013.01); *B23K 9/167* (2013.01); *B23K 26/0622* (2015.10); *B23K 26/21* (2015.10); *H05K 1/18* (2013.01); *H01L 24/02* (2013.01); *H01L 24/07* (2013.01); *H01L 24/08* (2013.01); *H01L 24/09* (2013.01); *H01L 24/42* (2013.01); *H01L 24/44* (2013.01); *H01L 24/45* (2013.01); *H01L 24/46* (2013.01); *H01L 24/85* (2013.01);
*H01L 2224/02163* (2013.01); *H01L 2224/02185* (2013.01); *H01L 2224/80007* (2013.01); *H01L 2224/80009* (2013.01); *H01L 2224/8019* (2013.01); *H01L 2224/8034* (2013.01); *H05K 3/328* (2013.01); *H05K 2201/10242* (2013.01);
(Continued)

(58) Field of Classification Search
CPC .......... H01L 24/42; H01L 24/44–24/46; H01L 24/85; H05K 3/103; H05K 3/328; H05K 2201/10265; H05K 2201/10287
See application file for complete search history.

(56) References Cited

U.S. PATENT DOCUMENTS 3,625,775 A  12/1971 MacKenzie et al.
6,033,233 A   3/2000 Haseyama et al.
(Continued)

FOREIGN PATENT DOCUMENTS

EP    0875331 A2   11/1998

OTHER PUBLICATIONS

French Search Report and Written Opinion for French Application No. 1658567, dated Apr. 11, 2018, 6 pages.

*Primary Examiner* — David Zarneke
(74) *Attorney, Agent, or Firm* — TraskBritt

(57) ABSTRACT

A method of forming a microelectronic device structure comprises coiling a portion of a wire up and around at least one sidewall of a structure protruding from a substrate. At least one interface between an upper region of the structure and an upper region of the coiled portion of the wire is welded to form a fused region between the structure and the wire.

12 Claims, 2 Drawing Sheets

(51) Int. Cl.
*H05K 3/32* (2006.01)
*B23K 26/21* (2014.01)
*B23K 9/09* (2006.01)
*B23K 9/167* (2006.01)
*B23K 26/0622* (2014.01)
*H05K 1/18* (2006.01)

(52) U.S. Cl.
CPC .............. *H05K 2201/10265* (2013.01); *H05K 2201/10287* (2013.01)

(56) References Cited

U.S. PATENT DOCUMENTS

| | | | |
|---|---|---|---|
| 6,659,778 B2 | 12/2003 | Li | |
| 6,712,620 B1* | 3/2004 | Li | H01R 12/714 |
| | | | 439/394 |
| 6,717,421 B1* | 4/2004 | Kazama | G01R 1/06716 |
| | | | 174/261 |
| 6,948,940 B2 | 9/2005 | Lindsey et al. | |
| 7,040,902 B2* | 5/2006 | Li | H01R 13/2407 |
| | | | 257/E23.067 |
| 7,989,838 B2 | 8/2011 | Ku | |
| 8,644,029 B1* | 2/2014 | Ji | H05K 3/3415 |
| | | | 361/763 |
| 9,275,970 B1* | 3/2016 | Chen | H01L 24/48 |
| 2004/0203262 A1 | 10/2004 | Lindsey et al. | |
| 2007/0046313 A1 | 3/2007 | Eldridge et al. | |
| 2011/0059661 A1* | 3/2011 | Inomata | H01R 13/111 |
| | | | 439/841 |
| 2015/0027770 A1 | 1/2015 | Chou et al. | |
| 2015/0061161 A1* | 3/2015 | Lee | H01L 24/45 |
| | | | 257/784 |
| 2016/0286655 A1* | 9/2016 | Cho | H01L 23/645 |

\* cited by examiner

METHODS OF FORMING A MICROELECTRONIC DEVICE STRUCTURE, AND RELATED MICROELECTRONIC DEVICE STRUCTURES AND MICROELECTRONIC DEVICES

CROSS-REFERENCE TO RELATED APPLICATION

This application is a divisional of U.S. patent application Ser. No. 14/859,026, filed Sep. 18, 2015, now U.S. Pat. No. 9,717,148, issued Jul 25, 2017, the disclosure of which is hereby incorporated herein in its entirety by this reference.

FIELD

The disclosure, in various embodiments, relates generally to the field of manufacturing microelectronic devices. More particularly, embodiments of the disclosure relate to methods of forming a microelectronic structure including a wire welded to another structure, and to related microelectronic device structures and microelectronic devices.

BACKGROUND

Microelectronic devices typically include an integrated circuit (IC) die (e.g., chip) housed within an IC package that is mounted to a printed circuit board (PCB). The IC package generally includes lead structures (e.g., pins, columns, balls, etc.) soldered to the PCB and coupled to bond pads on the IC die by way of bonding wires, also known as wire bonds. Conventionally, the bonding wires are attached to the lead structures of the IC package and to the bond pads of the IC die through one or more of solder joints, braze joints, and weld joints. The bond pads and bonding wires electrically connect the circuitry of the IC die to the lead structures of the IC package so that the circuitry can be used in the microelectronic device.

Unfortunately, conventional configurations (e.g., shapes, sizes, material compositions, arrangements, etc.) of bonding wires, lead structures, and/or joints (e.g., solder joints, braze joints, weld joints, etc.) between the bonding wires and the lead structures can be insufficient to lastingly employ microelectronic devices exhibiting such conventional configurations in hostile environments, such as the high-temperature, high-pressure, corrosive, and/or abrasive environments frequently associated with downhole applications (e.g., drilling applications, conditioning applications, logging applications, measurement applications, monitoring applications, exploring applications, etc.). For example, at temperatures above 200° C., the copper of conventional silver plated copper bonding wires may migrate through the silver plating and react with the tin of conventional solder joints to form bronze crystals that weaken and decrease the life of the solder joint. In addition, the configurations and methods of forming conventional weld joints (e.g., conventional butt joints, conventional lap joints, etc.) between bonding wires and other structures (e.g., lead structures, etc.) can result in weak points (e.g., a necked-down region) and/or can facilitate unmitigated strain between the conventional weld joints and the other structures, which can effectuate undesirable detachment of the bonding wires during use and operation.

It would, therefore, be desirable to have new methods and structures that facilitate the connection of components (e.g., lead structures, etc.) of a microelectronic device while mitigating one or more of the problems conventionally associated with such connection.

BRIEF SUMMARY

Embodiments described herein include methods of forming a microelectronic device structure, related microelectronic device structures, and related microelectronic devices. For example, in accordance with one embodiment described herein, a method of forming a microelectronic device structure comprises coiling a portion of a wire up and around at least one sidewall of a structure protruding from another structure. At least one interface between an upper region of the structure and an upper region of the coiled portion of the wire is welded to form a fused region between the structure and the wire.

In additional embodiments, a microelectronic device structure comprises a structure protruding from a surface of another structure and comprising a proximal region adjacent an interface between the structure and the surface of the another structure and a distal region opposing the proximal region, a wire coiled around at least one sidewall of the structure, and a fused region integral and continuous with the distal region of the structure and a terminal end of the wire.

In further embodiments, a microelectronic device comprises a microelectronic device structure comprising at least one structure longitudinally projecting from a surface of another structure, and at least one wire coupled to the at least one structure. A portion of the at least one wire is coiled up and around the at least one structure and is attached to the at least one structure through at least one fused region integral and continuous with the at least one structure and the at least one wire

DETAILED DESCRIPTION

Figure 1:
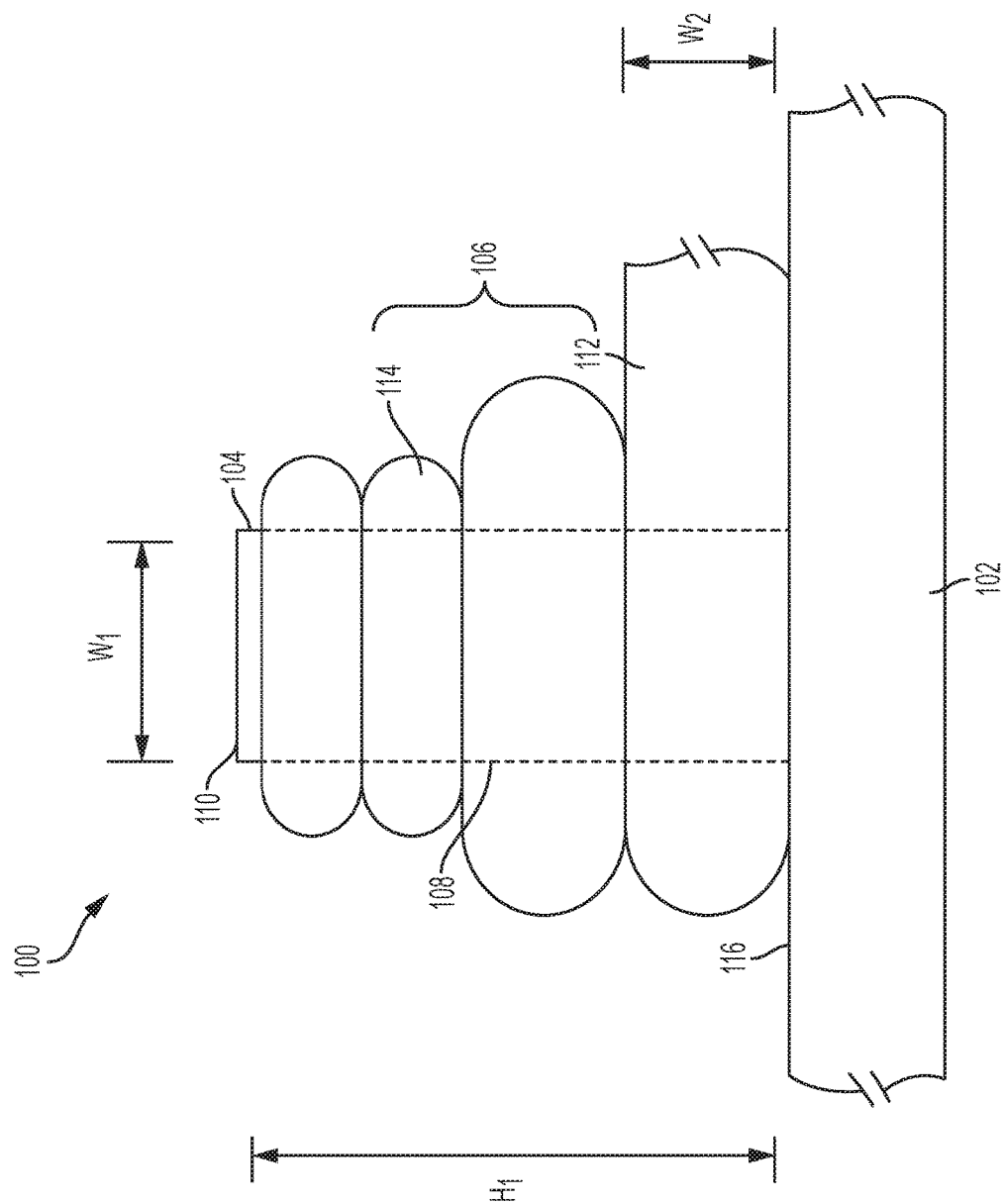
FIGS. 1 and 2 are partial, side elevation views illustrating a method of forming a microelectronic device structure, in accordance with an embodiment of the disclosure.

Methods of forming a microelectronic device structure are described, as are microelectronic device structures, and microelectronic devices. In some embodiments, a method of forming a microelectronic device structure includes coiling a wire up and around a structure protruding from a substrate, and then subjecting upper regions of the structure and the coiled portion of the wire to at least one welding process to fuse the wire to the structure. The configurations (e.g., shapes, sizes, material compositions, arrangements, etc.) of the wire and the structure may be selected relative to one another to form a robust connection (e.g., joint) between the wire and the structure having one or more enhanced properties (e.g., structural integrity, thermal stability, corrosion resistance, etc.) as compared to many conventional connections between wires and structures. The microelectronic device structure may be included in a microelectronic device for use in a given application (e.g., a downhole application, an aerospace application, a purified liquid and gas handling application, a medical application, a petrochemical application, an industrial application, etc.). The methods, microelectronic device structures, and microelectronic devices of the disclosure may provide reduced costs and enhanced efficiency, reliability, and durability relative to conventional methods, microelectronic device structures, and microelectronic devices.

The following description provides specific details, such as material types and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided herein does not form a complete process flow for forming a microelectronic device structure or a microelectronic device. Only those process acts and structures necessary to understand the embodiments of the disclosure are described in detail below. Additional acts to form the complete microelectronic device structure and/or microelectronic device may be performed by conventional fabrication techniques. Also note, any drawings accompanying the present application are for illustrative purposes only, and are thus not drawn to scale. Additionally, elements common between figures may retain the same numerical designation.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the singular forms "a," "an," and "the" are intended to include the plural forms as well, unless the context clearly indicates otherwise.

As used herein, the term "and/or" includes any and all combinations of one or more of the associated listed items.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the temi "about" in reference to a given parameter i s inclusive of stated value and has the meaning dictated by the context (e.g., it includes the degree of error associated with measurement of the given parameter).

As used herein, each of the terms "configured" and "configuration" refers to a size, shape, material composition, and arrangement of one or more of at least one structure and at least one apparatus facilitating operation of one or more of the structure and the apparatus in a pre-determined way.

Figure 2:
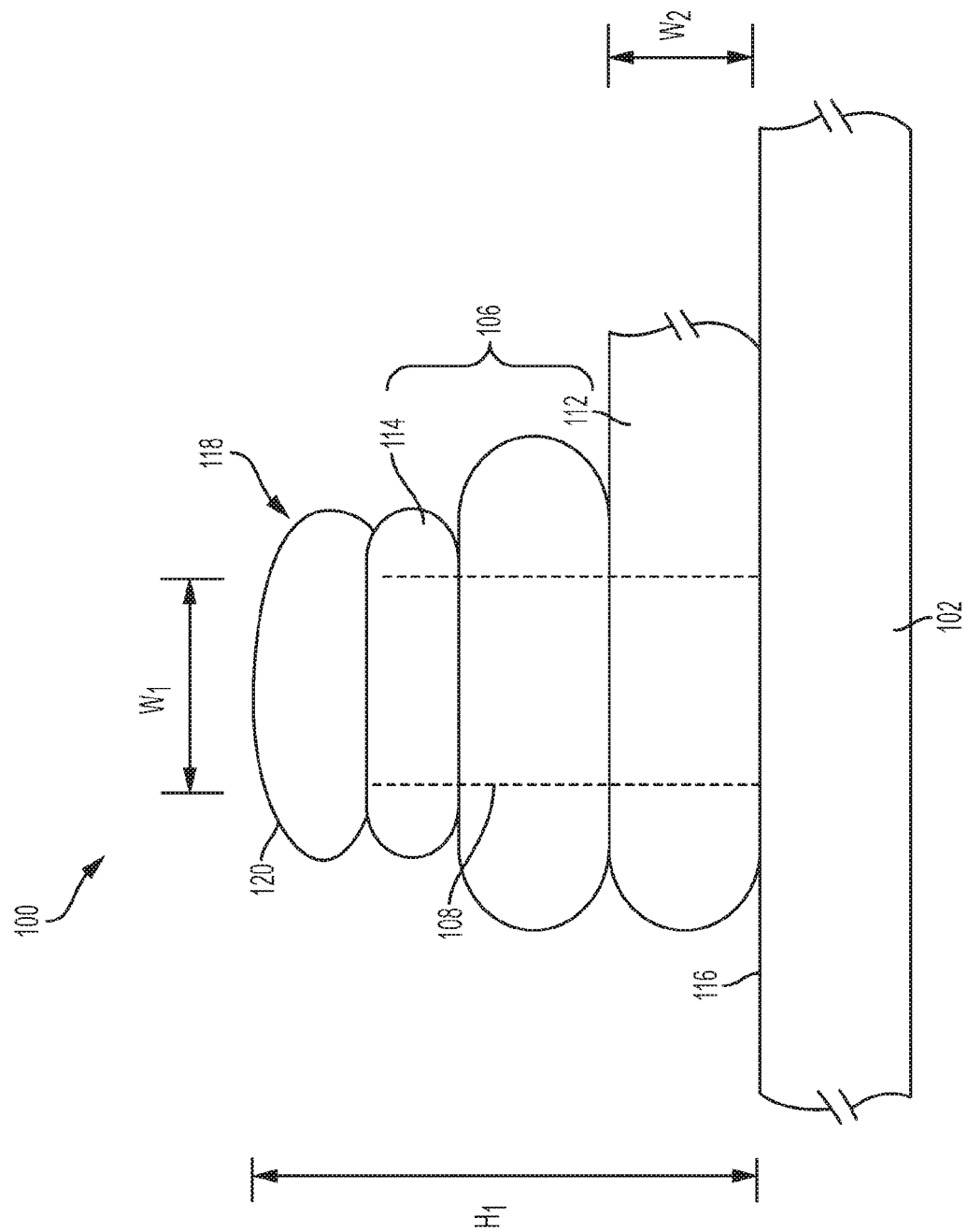

FIGS. 1 and 2 are partial, side elevation views illustrating embodiments of a method of forming a microelectronic device structure including at least one wire (e.g., at least one bonding wire) coupled to at least one other structure (e.g., at least one pin, such as at least one I/O pin). With the description as provided below, it will be readily apparent to one of ordinary skill in the art that the process described herein may be used in various applications. In other words, the process may be used whenever it is desired to attach a wire to another structure.

Referring to FIG. 1, a microelectronic device structure 100 may include a substrate 102, at least one structure 104 projecting (e.g., protruding, extending, etc.) from the substrate 102, and at least one wire 106 at least partially surrounding the structure 104. As used herein, the term "substrate" means and includes a base material or construction upon which additional materials are formed. The substrate 102 may be an IC package, a ceramic or fiberglass-reinforced (e.g. FR-4) circuit board, a polymeric material (e.g., a polyimide material), a semiconductor substrate, a metal electrode, or a semiconductor substrate having one or more materials, structures, or regions formed or otherwise located thereon. Previous process acts may have been conducted to form materials, regions, or junctions in the base semiconductor structure or foundation. By way of non-limiting example, the substrate 102 may comprise one or more of silicon, silicon dioxide, silicon with native oxide, silicon nitride, a glass, a polymeric material, a semiconductor material, a metal, a metal alloy, a ceramic material, a metal oxide, a titanium nitride, tantalum, a tantalum nitride, niobium, a niobium nitride, a molybdenum nitride, molybdenum, tungsten, a tungsten nitride, copper, cobalt, nickel, iron, aluminum, and a noble metal. In some embodiments, the substrate 102 comprises a material formulated to maintain structural stability at high temperatures (e.g., temperatures greater than or equal to about 150° C.), such as a polyimide material. Suitable materials are commercially available from numerous sources, such as from Dupont Company (Wilmington, Del.), under the KAPTON® tradename.

As shown in FIG. 1, the structure 104 (e.g., pin) may longitudinally extend from an upper surface 116 the substrate 102. As used herein, each of the terms "longitudinal" and "vertical" means and includes extending in a direction substantially perpendicular to the substrate 102, regardless of the orientation of the substrate 102. Accordingly, as used herein, each of the terms "lateral" and "horizontal" means and includes extending in a direction substantially parallel to the substrate 102, regardless of the orientation of the substrate 102. In some embodiments, the structure 104 is integral and continuous with the substrate 102. For example, the structure 104 and a conductive structure such as a contact or wiring trace on the substrate 102 may form a single, substantially monolithic body. In additional embodiments, the structure 104 and the substrate 102 are discrete from but connected to one another. For example, the structure 104 may be attached to the upper surface 116 of the substrate 102. In some embodiments, the structure 104 extends into and contacts surfaces within an opening (e.g., a via, such as a blind via or a through via) in the upper surface 116 of the substrate 102, such as an inner wiring layer of a circuit board.

The structure 104 may include at least one sidewall 108 (shown as dashed lines), and at least one upper surface 110 distal from the upper surface 116 of the substrate 102. The structure 104 may exhibit any desired shape and any desired size facilitating the attachment of the wire 106 thereto, as described in further detail below. The shape and the size of the structure 104 may facilitate direct physical contact between the structure 104 and at least a portion of the wire 106. The shape and the size of the structure 104 may be selected to maximize the surface area of the wire 106 that directly physically contacts the surface area of the structure 104. For example, the shape and the size of the structure 104 may be selected to permit a portion of the wire 106 to be coiled (e.g., spiraled) around the structure 104 with substantially no space (e.g., separation) between each sidewall 108 of the structure 104 and a surface of the coiled portion of the wire 106 across an entire length of the coiled portion of the wire 106. In some embodiments, the structure 104 comprises cylindrical column (e.g., pin) exhibiting a height $H_1$ and a width $W_1$ (e.g., diameter). In additional embodiments, the structure 104 may exhibit a different shape (e.g., a dome shape, a cone shape, a frusto cone shape, a tube shape, rectangular column shape, a fin shape, a pillar shape, a stud shape, a pyramid shape, a frusto pyramid shape, an irregular shape, etc.) and/or a different size (e.g., a different height, a different width, etc.). Accordingly, the structure 104 may exhibit any desired lateral cross-sectional shape (e.g., a circular shape, an ovular shape, a square shape, a rectangular shape, a trapezium shape, a trapezoidal shape, a parallelogram shape, an annular shape, a triangular shape, a semi-circular shape, an elliptical shape, etc.) and any desired lateral cross-sectional area. In some embodiments, the structure 104 exhibits a substantially circular lateral cross-sectional shape.

The structure 104 may be formed of and include at least one material that is resistant to one or more of thermal degradation, chemical degradation (e.g., corrosion and physical degradation (e.g., abrasion, erosion, etc.) The structure 104 may, for example, be formed of and include at least one material suitable for use in high-temperature, high-pressure, corrosive, and/or abrasive environments, such as the extremely aggressive environments of various downhole applications (e.g., drilling applications, conditioning applications, logging applications, measurement applications, monitoring applications, exploring applications, etc.). By way of non-limiting example, the structure 104 may be formed of and include a high melting point, corrosion-resistant conductive material, such as a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum, etc.), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel, etc.), a conductive metal-containing material (e.g., a conductive metal nitride, a conductive metal silicide, a conductive metal carbide, a conductive metal oxide), a conductively doped semiconductor material (e.g., conductively doped silicon, conductively doped germanium, conductively doped silicon germanium), a conductive ceramic material (e.g., carbides, nitrides, oxides, and/or borides, such as carbides and borides of at least one of tungsten, titanium, molybdenum, niobium, vanadium, hafnium, tantalum, chromium, zirconium, aluminum, and silicon), a conductive ceramic-metal composite material, or combinations thereof. In some embodiments, the structure 104 is formed of and includes a metal alloy including elements of one or more of Groups VIII and IB of the Periodic Table of Elements (e.g., two or more of iron, ruthenium, osmium, cobalt, rhodium, iridium, nickel, palladium, platinum, copper, silver, and gold), such as a nickel-cobalt ferrous alloy. Suitable materials for the structure 104 are commercially available from numerous sources, such as from CRS Holdings, Inc. of Wilmington, Del., under the trade name KOVAR®. In some embodiments, the structure 104 is formed of and includes KOVAR® alloy.

While various embodiments herein are described and illustrated in the context of the microelectronic device structure 100 including only one structure 104 (i.e., a single structure 104), the microelectronic device structure 100 may, alternatively, include more than one structure 104 (i.e., multiple structures 104). In such embodiments, each of the multiple structures 104 may be substantially the same (e.g., exhibit substantially the same shape, size, and material composition) as one another, or at least one of the multiple structures 104 may be different (e.g., exhibit at least one of a different shape, a different size, and a different material composition) than at least one other of the multiple structures 104.

The wire 106 comprises an at least partially conductive structure at least partially surrounding the structure 104. As shown in FIG. 1, the wire 106 may include a sheathed region 112 and an unsheathed region 114. The sheathed region 112 may include an insulating material surrounding (e.g., enveloping, encasing, etc,) a conductive material, and the unsheathed region 114 may be substantially free of the insulating material (e.g., the insulating material may be absent from the unsheathed region 114 such that a conductive material is exposed). Each of the sheathed region 112 and the unsheathed region 114 of the wire 106 may physically contact and at least partially surround the structure 104. For example, and as described in further detail below, the sheathed region 112 may physically contact and at least partially surround a lower region (e.g., a region proximate the upper surface 116 of the substrate 102) of the structure 104, and the unsheathed region 114 may physically contact and at least partially surround an upper region (e.g., a region proximate the upper surface 110 of the structure 104, a region distal to the upper surface 116 of the substrate 102 from which the structure 104 extends) of the structure 104. In additional embodiments, the sheathed region 112 may not physically contact and at least partially surround the structure 104. For example, the sheathed region 112 may be sufficiently recessed relative to a terminal end of the wire 106 so that only the unsheathed region 114 thereof physically contacts and at least partially surrounds the structure 104, or the sheathed region 112 may be completely omitted from the wire 106 so that the wire 106 comprises an unsheathed, conductive structure.

The wire 106 may be formed of and include any material composition that is compatible with the material composition of the structure 104, and that is resistant to one or more of thermal degradation, chemical degradation (e.g., corrosion), a physical degradation (e.g., abrasion, erosion, etc.). As used herein, the term "compatible" means and includes a material that does not react with, break down, or absorb another material in an unintended way, and that also does not impair the chemical and/or mechanical properties of the another material in an unintended way. By way of non-limiting example, the wire 106 may be formed of and include a conductive material that is able to be welded (e.g., laser welded, pulse arc welded, etc.) to the structure 104 to form a fused region (e.g., weld joint) that maintains structural integrity under the conditions (e.g., high temperatures, high pressures, corrosive materials, abrasive materials, etc.) present in a downhole environment. The conductive material of the wire 106 may, for example, be selected relative to the conductive material of the structure 104 to form a fused region that maintains structural integrity at temperatures within a range of from about −40° C. to about 350° C. or higher, such as temperatures greater than or equal to about 150° C., greater than or equal to about 200° C., greater than or equal to about 250° C., greater than or equal to about 300° C., or greater than or equal to about 350° C. In some embodiments, the wire 106 is formed of and includes a conductive material that is able to be welded to the structure 104 to form a fused region that maintains structural integrity at temperatures greater than or equal to about 200° C.

By way of non-limiting example, depending at least on the material composition of the structure 104, the conductive material of the wire 106 may be formed of and include a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum, etc.), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel, etc.), a conductive metal-containing material (e.g., a conductive metal nitride, a conductive metal silicide, a conductive metal carbide, a conductive metal oxide), a conductively doped semiconductor material (e.g., conductively doped silicon, conductively doped germanium, conductively doped silicon germanium), a conductive ceramic material (e.g., carbides, nitrides, oxides, and/or borides, such as carbides and borides of at least one of tungsten, titanium, molybdenum, niobium, vanadium, hafnium, tantalum, chromium, zirconium, aluminum, and silicon), a conductive ceramic-metal composite material, or combinations thereof In some embodiments, the conductive material of the wire 106 is formed of and includes a metal selected from one of Groups VIII and IB of the Periodic Table of Elements (e.g., iron, ruthenium, osmium, cobalt, rhodium, iridium, nickel, palladium, platinum, copper, silver, and gold), such as nickel (Ni). For example, in some embodiments, such as in some embodiments wherein the structure 104 is formed of and includes KOVAR® alloy, the conductive material of the wire 106 is formed of and includes substantially pure (e.g., elemental) Ni, such as Ni200. In additional embodiments, the conductive material of the wire 106 is formed of and includes substantially pure copper (Cu). The conductive material of the wire 106 may be substantially homogeneous (e.g., unplated, such as a metal structure substantially free of another metal structure thereover), or may be heterogeneous (e.g., plated, such as a metal structure having another metal structure thereover). In some embodiments, the conductive material of the wire 106 is substantially homogeneous.

The conductive material of the wire 106 may comprise an annealed (e.g., heat treated) conductive material (e.g., an annealed metal, such as annealed Ni or annealed Cu; an annealed metal alloy; etc.). The material properties (e.g., softness, ductility, etc.) of the annealed conductive material may facilitate the relatively simple and efficient placement of the wire 106 around the structure 104 as compared to a non-annealed version of the conductive material. In some embodiments, the conductive material of the wire 106 is formed of and includes annealed, substantially pure Ni (e.g., annealed Ni200). In additional embodiments, the conductive material of the wire 106 is formed of and includes annealed, substantially pure Cu. In further embodiments, the conductive material of the wire 106 comprises a non-annealed conductive material. In such embodiments, the material properties of the non-annealed conductive material may be sufficient to facilitate the simple and efficient placement of the wire 106 around the structure 104.

The conductive material of the wire 106 may take the form of a single (e.g., monolithic, unitary, etc.), solid structure. For example, the wire 106 may comprise a single, solid conductive structure (e.g., a single, solid, annealed, substantially pure Ni structure; a single, solid, annealed, substantially pure Cu structure; etc.), as opposed to, for instance, multiple solid conductive structures (e.g., as in a stranded wire configuration). In some embodiments, the wire 106 comprises a single, solid, annealed Ni200 structure. The single, solid structure of the conductive material may facilitate the simple and efficient placement of the wire 106 around the structure 104, and may also facilitate the simple and efficient formation of a relatively robust (e.g., strong, non-brittle, etc.) and durable fused region between the wire 106 and the structure 104 through subsequent processing (e.g., as compared to a fused region formed between the structure 104 and a stranded wire comprising multiple solid conductive structures), as described in further detail below. In additional embodiments, the conductive material of the wire 106 may take the form of multiple solid conductive structures (e.g., as in a stranded wire configuration).

The wire 106 may exhibit any desired shape and any desired size facilitating the attachment of the wire 106 to the structure 104. The shape and the size of the wire 106 may facilitate direct physical contact between the structure 104 and at least a portion of the wire 106. The shape and the size of the wire 106 may be selected to maximize the surface area of the wire 106 that directly physically contacts the surface area of the structure 104. For example, the shape and the size of the structure 104 may be selected to permit a portion of the wire 106 to be coiled (e.g., spiraled) around the structure 104 with substantially no space (e.g., separation) between each sidewall 108 of the structure 104 and a surface of the coiled portion of the wire 106 across an entire length of the coiled portion of the wire 106. In some embodiments, the wire 106 comprises a generally cylindrical structure exhibiting a maximum width $W_2$ (e.g., a maximum diameter) that is smaller than the width $W_1$ of the structure 104, and a length sufficient to attach the wire 106 to the structure 104 and at least one additional structure. In additional embodiments, the wire 106 may exhibit a different shape (e.g., a different generally cylindrical shape, a generally rectangular shape, a tape shape, an irregular shape, etc.) and/or a different size (e.g., a different width, a different length, etc.). Accordingly, the wire 106 may exhibit any desired transverse cross-sectional shape (e.g., a circular shape, an ovular shape, a square shape, a rectangular shape, a trapezium shape, a trapezoidal shape, a parallelogram shape, an annular shape, a triangular shape, a semicircular shape, an elliptical shape, etc.) and any desired lateral cross-sectional area. In some embodiments, the wire 106 comprises 26 gauge annealed Ni200 wire.

With reference to FIG. 1, the wire 106 may be partially coiled around the structure 104. For example, beginning at a lower region (e.g., a base) of the structure 104 (e.g., a region of the structure 104 proximate the upper surface 116 of the substrate 102), the wire 106 may progressively coil (e.g., spiral, wrap, etc.) upward around the sidewall 108 of the structure 104. In some embodiments, the sheathed region 112 of the wire 106 is coiled around a periphery of the lower region of the structure 104, and the unsheathed region 114 of the wire 106 is coiled around a periphery of an upper region of the structure 104 (e.g., a region of the structure 104 more proximate the upper surface 110 of the structure 104, a region of the structure 104 more distal to the upper surface 116 of the substrate 102). In additional embodiments, the unsheathed region 114 of the wire 106 is coiled around a periphery of the lower region of the structure 104 and around a periphery of the upper region of the structure 104. Coiling the wire 106 around the structure 104 may reduce strain between the wire 106 and a subsequently formed fused region (e.g., weld joint) between the wire 106 and the structure 104 as compared to conventional means of attaching a wire to another structure (e.g., a pin). Reducing the strain between the wire 106 and the subsequently formed fused region may significantly reduce the risk of the wire 106 becoming separated from (e.g., detached from, pulled away from, etc.) the structure 104, improving the durability and reliability of the microelectronic device structure 100 as compared to conventional microelectronic device structures not including a coiled configuration of a wire relative to another structure.

The wire 106 may be coiled around the at least one sidewall 108 of the structure 104 greater than or equal to about one time (1×). The number of times the wire 106 is coiled around the sidewall 108 may least partially depend on the configurations (e.g., sizes, shapes, material compositions, etc.) of the structure 104 and the wire 106, and on the desired amount of strain relief between the wire 106 and a subsequently formed fused region (e.g., weld joint) between the wire 106 and the structure 104 (e.g., which may at least partially depend on the particular application of the microelectronic device structure 100). In some embodiments, the sheathed region 112 of the wire 106 and the unsheathed region 114 of the wire 106 are each independently coiled around the sidewall 108 of the structure 104 greater than or equal to about one time (e.g., greater than or equal to about one and one-half times (1.5×), between about one and one-half times (1.5×) and about two times (2×), greater than or equal to about two times (2×), etc.). In additional embodiments, only the unsheathed region 114 of the wire 106 is coiled around the sidewall 108 of the structure 104 greater than or equal to about one (1) time (e.g., greater than or equal to about one and one-half times (1.5×), between about one and one-half times (1.5×) and about two times (2×), greater than or equal to about two times (2×), greater than or equal to about three times (3×), greater than or equal to about four times (4×), etc.).

The wire 106 may be coiled around the at least one sidewall 108 of the structure 104 up to the height $H_1$ of the structure 104. A maximum height of the coiled the wire 106 may be less than, substantially equal to, or greater than the height $H_1$ (of the structure 104. In some embodiments, the maximum height of the coiled portion of the wire 106 is less than the height $H_1$ of the structure 104. In additional embodiments, the maximum height of the coiled portion of the wire 106 is approximately equal to the height $H_1$ of the structure 104. In further embodiments, the maximum height of the coiled portion of the wire 106 is greater than the height $H_1$ of the structure 104. Optionally, a terminal end of the wire 106 may be shaped to facilitate a relatively smooth transition between the terminal end of the wire 106 and the upper surface 110 of the structure 104. As a non-limiting example, the terminal end of the wire 106 may be non-perpendicularly angled (e.g., an oblique angle) relative to a central axis of the wire 106 such that the terminal end of the wire 106 is at least closer to being coplanar with the upper surface 110 of the structure 104 than if the terminal end of the wire 106 was perpendicularly angled relative to the central axis of the wire 106. The non-perpendicular angle of the terminal end of the wire 106 relative to the central axis of the wire 106 may impede or prevent the formation of a hole (e.g., a void) at the location of the terminal end of the wire 106 in a subsequently formed fused region between the wire 106 and the structure 104. In additional embodiments, the terminal end of the wire 106 may be perpendicularly angled relative to a central axis of the wire 106.

The wire 106 may be tightly coiled around the at least one sidewall 108 of the structure 104 such that there is substantially no lateral separation (e.g., no lateral space, no lateral gap, etc.) between the sidewall 108 of the structure 104 and a surface of the wire 106 along the coiled portion of the wire 106. Having substantially no lateral separation between the sidewall 108 of the structure 104 and the coiled portion of the wire 106 may at least partially (e.g., entirely) eliminate the need for filler material during subsequent processing (e.g., subsequent welding) to form a fused region between the structure 104 and the wire 106. In addition, the wire 106 may be coiled such that there is substantially no longitudinal separation (e.g., no longitudinal space, no longitudinal gap, etc.) between immediately longitudinally adjacent coils of the coiled portion of the wire 106, or may be coiled such that there is longitudinal separation between at least one coil of the coiled portion of the wire 106 and at least other coil of the coiled portion of the wire 106 immediately longitudinally adjacent to the at least one coil. Furthermore, the sidewall 108 of the structure 104 may be substantially completely covered by the coiled portion of the wire 106, or one or more portions of the sidewall 108 of the structure 104 may remain uncovered by the coiled portion of the wire 106. In some embodiments, the wire 106 is configured such that one or more of a portion of an upper region of the sidewall 108 of the structure 104 and a portion of a lower region of the sidewall 108 of the structure 104 remain uncovered by the coiled portion of the wire 106.

While various embodiments herein are described and illustrated in the context of the microelectronic device structure 100 including only one wire 106 (i.e., a single wire 106), the microelectronic device structure 100 may, alternatively, include more than one wire 106 (i.e., multiple wires 106). In such embodiments, each of the multiple wires 106 may be substantially the same (e.g., exhibit substantially the same shape, size, material composition, sheathing, and coiling) as one another, or at least one of the multiple wires 106 may be different (e.g., exhibit one or more of a different shape, a different size, a different material composition, different sheathing, and different coiling) than at least one other of the multiple wires 106.

The wire 106 may be formed on or over the upper surface 116 of the substrate 102 and around the sidewall 108 of the structure 104 using conventional processes (e.g., sheath removal processes, wire coiling processes, wire cutting processes, etc.) and conventional processing equipment, which are not described in detail herein. By way of non-limiting example, a predetermined length of the insulative material (e.g., the insulative sheath) of the wire 106 may be removed using at least one stripping process (e.g., a thermal stripping process) to form the unsheathed region 114 of the wire 106 and the remaining, sheathed region 112 of the wire 106. At least a portion of the unsheathed region 114 and, optionally, a portion of the sheathed region 112, may then be progressively coiled up and around the sidewall 108 of the structure 104 using at least one wire coiling device (e.g., a wire wrapping tool, a lathe collet, etc.). Upon achieving a predetermined height of the coiled portion of the wire 106 (e.g., less than or equal to the height $H_1$ of the structure 104), the terminal end of the wire 106 may be cut (e.g., diagonally cut, orthogonally cut, etc.). The cut terminal end of the wire 106 may then be pressed down to physically contact an underlying coil of the wire 106 and the sidewall 108 of the structure 104.

In further embodiments, the wire 106 may be positioned adjacent to the structure 104 in a substantially uncoiled configuration. The substantially uncoiled configuration of the wire 106 may, for example, facilitate the subsequent formation of a lap joint or a butt joint between the structure 104 and the wire 106. As a non-limiting example, the wire 106 may be positioned adjacent the sidewall 108 of the structure 104 without being coiled up and around the sidewall 108. As another non-limiting example, the wire 106 may be positioned on the upper surface 110 of the structure 104. Such uncoiled configurations of the wire 106 relative to the structure 104 may not facilitate as much strain relief between the wire 106 and a subsequently formed fused region (e.g., lap joint, butt joint, etc.), but may still provide the subsequently formed fused region with enhanced properties (e.g., thermal stability, corrosion resistance, etc.) as compared to a conventional fused region between a wire and another structure (e.g., pin). In such embodiments, a sleeve structure (e.g., a collar structure) may, optionally, be provided on or over portions of the subsequently formed fused region, the structure 104, and the wire 106 to enhance stiffness at the fused region and mitigate any effects of necking down between the fused region and at least one of the wire 106 and the structure 104.

Referring next to FIG. 2, the microelectronic device structure 100 may be subjected to at least one welding process to form at least one fused region 118 (e.g., weld joint) between the structure 104 and the wire 106. The welding process may melt an upper portion of the structure 104 and an upper portion of the wire 106 coiled around the upper portion of the structure 104 to form the fused region 118. The fused region 118 may exhibit properties (e.g., mechanical strength, thermal resistance, chemical resistance, wear resistance, etc.) favorable to the use of the microelectronic device structure 100 in hostile environmental conditions (e.g., high temperatures, high pressures, corrosive conditions, abrasive conditions, etc.), such as the environment conditions of various downhole applications.

As shown in FIG. 2, in some embodiments, the fused region 118 exhibits a generally dome-shaped structure. For example, the fused region 118 may include an arcuate (e.g., curved, rounded, etc.) upper surface 120. In additional embodiments, the fused region 118 exhibits a shape other than a generally dome-shaped structure. For example, the fused region 118 may comprise at least two joints (e.g., at least two laterally opposing joints, such as at least two laterally opposing weld joints; at least three symmetrically distributed joints, such as at least three symmetrically distributed weld joints; etc.) disposed between the upper portion of the structure 104 and the upper portion of the wire 106 coiled around the upper portion of the structure 104. The fused region 118 may extend outwardly beyond the lateral boundaries of the at least one sidewall 108 of the structure 104 (FIG. 1). The fused region 118 may extend substantially uniformly (e.g., evenly) outwardly beyond the lateral boundaries of the sidewall 108, or may extend non-uniformly (e.g., non-evenly) outwardly beyond the lateral boundaries of the sidewall 108. In addition, the fused region 118 may be substantially confined within the lateral boundaries of a remaining coiled portion (e.g., a remaining coiled portion of the unsheathed region 114) of the wire 106, or may extend outwardly beyond the lateral boundaries of a remaining coiled portion (e.g., a remaining coiled portion of the unsheathed region 114) of the wire 106 thereunder.

The material composition of the fused region 118 at least partially depends on the material compositions of the structure 104 and the wire 106. In some embodiments, such as in embodiments wherein the structure 104 is formed of and includes a nickel-cobalt ferrous alloy (e.g., KOVAR® alloy) and the wire 106 is formed of and includes Ni (e.g., Ni200), the fused region 118 is formed of and includes Ni, Co, and Fe. The fused region 118 may be substantially homogeneous (e.g., exhibiting a substantially uniform distribution of each material component thereof), or may be heterogeneous (e.g., exhibiting a non-uniform distribution of at least one material component thereof). In some embodiments, the fused region 118 is substantially homogeneous. If, for example, the structure 104 is formed of and includes a nickel-cobalt ferrous alloy and the wire 106 is formed of and includes Ni, the fused region 118 may exhibit a substantially uniform distribution of each of Ni, Co, and Fe throughout a thickness and a width thereof. In additional embodiments, the fused region 118 is heterogeneous. If, for example, the structure 104 is formed of and includes a nickel-cobalt ferrous alloy and the wire 106 is formed of and includes Ni, the fused region 118 may exhibit a substantially non-uniform distribution of one or more of Ni, Co, and Fe throughout one or more of a thickness and a width thereof Any welding process suitable to form the fused region 118 between the structure 104 and the wire 106 may be utilized. By way of non-limiting example, at least one micro welding process may be used to form the fused region 118. Suitable micro welding processes include, but are not limited to, laser welding processes; pulse arc welding processes, such as micro gas tungsten arc welding (micro-GTAW) (also known as micro tungsten inert gas (micro-TIG) welding) processes, and micro plasma arc welding (micro-PAW) processes; resistance discharge welding processes; and capacitive discharge welding processes.

In some embodiments, the microelectronic device structure 100 is subjected to at least one laser welding process to form the fused region 118. The laser welding process may include exposing surfaces of the structure 104 and the wire 106 (e.g., the upper surface 110 of the structure 104 and surfaces of the coiled portion of the wire 106 proximate the upper surface 110 of the structure 104) to at least one laser beam to heat and melt portions of the structure 104 and the wire 106 and form at least a portion of the fused region 118 upon cooling. The parameters (e.g., laser type, applied power, duration, etc.) of the laser welding process may be tailored to the material compositions of the structure 104 and the wire 106 to minimize reflection of the laser beam (and, hence, maximize absorption of incident laser energy) and avoid undesirable damage to the microelectronic device structure 100. Non-limiting examples of suitable lasers for the laser welding process may include neodymium-doped yttrium aluminum garnet (Nd:YAG) lasers, carbon dioxide ($CO_2$) lasers, diode lasers, and fiber lasers. In some embodiments, the welding process includes subjecting exposed surfaces of the structure 104 and the wire 106 to at least one Nd:YAG laser to form the fused region 118. The laser employed in the laser welding process may be operated in either a pulsed mode or a continuous mode. In addition, the laser welding process may form the fused region 118 without employing a filler material, or may utilize a filler material to form the fused region 118. In some embodiments, the laser welding process forms the fused region 118 without the use of a filler material.

In additional embodiments, the microelectronic device structure 100 is subjected to at least one pulse arc welding process to form the fused region 118. The pulse arc welding process may include forming at least one electric arc to heat and melt portions of the structure 104 and the wire 106 and form at least a portion of the fused region 118 upon cooling. The pulse arc welding process may comprise a transferred arc process or a non-transferred arc process. If a transferred arc process is utilized, at least one electric arc may be formed between an electrode (e.g., a non-consumable electrode, such as a tungsten electrode) and surfaces of the structure 104 and the wire 106 in the presence of a gas (e.g., an inert or semi-inert shield gas for a micro-GTAW process, such as a micro-TIG welding process; a gas plasma and an inert or semi-inert shield gas for a micro-PAW process; etc.) to heat and melt portions of the structure 104 and the wire 106 and form at least a portion of the fused region 118 upon cooling. If a non-transferred arc process is utilized, at least one electric arc may be formed between an electrode (e.g., a non-consumable electrode, such as a tungsten electrode) and a nozzle in the presence of a gas plasma, and an arc plasma exiting the nozzle may be directed to surfaces of the structure 104 and the wire 106 to heat and melt portions of the structure 104 and the wire 106 and form at least a portion of the fused region 118 upon cooling. In some embodiments, the welding process includes subjecting surfaces of the structure 104 and the wire 106 (e.g., the upper surface 110 of the structure 104 and surfaces of the coiled portion of the wire 106 proximate the upper surface 110 of the structure 104) to a micro-TIG welding process to form the fused region 118. The parameters (e.g., electrode, shielding gases, current pulse levels, applied power, duration, etc.) of the pulsed arc welding process may be tailored to the material compositions of the structure 104 and the wire 106 to provide desired weld properties (e.g., weld penetration, welding speed, weld pool control, weld quality, etc.) while avoiding undesirable damage (e.g., distortion, warpage, cracking, etc.) to one or more components of the microelectronic device structure 100. The pulsed arc welding process may form the fused region 118 without employing a filler material, or may utilize a filler material to form the fused region 118. In some embodiments, the pulsed arc welding process forms the fused region 118 without the use of a filler material.

The microelectronic device structure 100 may be exposed to a single welding process to form the fused region 118, or may be exposed to multiple welding processes to form the fused region 118. If multiple welding processes are utilized, one or more initial welding processes may form a preliminary fused region, and one or more secondary welding processes may modify one or more properties (e.g., shape, size, homogeneity, etc.) of the preliminary fused region to form the fused region 118. For example, at least one initial welding process (e.g., an initial laser welding process, an initial pulse arc welding process, etc.) may be used to continuously weld or spot weld different portions of one or more interfaces between the structure 104 and the wire 106 and form a preliminary fused region, and at least one additional welding process (e.g., an additional laser welding process, an additional pulse arc welding process, etc.) may be use to smooth out and increase the homogeneity of the preliminary fused region to form the fused region 118. Each of the multiple welding processes may be substantially the same, or at least one of the multiple welding processes may be different than at least one other of the multiple welding processes. In some embodiments, an initial Nd:YAG laser-based welding process is performed to form a plurality (e.g., from three (3) to six (6), such as from four (4) to five (5)) of initial welds (e.g., overlapping welds) along interfaces between surfaces (e.g., the sidewall 108, the upper surface 110) of an upper portion of the structure 104 and adjacent surfaces of the wire 106, and an additional Nd:YAG laser-based welding process is performed to modify (e.g., melt, smoothen, etc.) the initial welds and form the fused region 118.

The structures and methods of the disclosure facilitate the less complicated and efficient formation of microelectronic device structures (e.g., the microelectronic device structure 100) exhibiting enhanced properties (e.g., thermal stability, corrosion resistance, erosion resistance, etc.) under various environmental conditions (e.g., high temperatures, high pressures, corrosive conditions, abrasive conditions, etc.) as compared to conventional microelectronic device structures exhibiting different configurations of one or more components. For example, the configuration of the microelectronic device structure 100 (e.g., including the configurations of the structure 104, the wire 106, and the fused region 118 between the structure 104 and the wire 106) may avoid one or more problems (e.g., undesirable material migration; structural weak points, such as necked-down regions; structural detachments, such as strain-based wire detachments; etc.) associated with the configurations of conventional microelectronic device structures. In turn, microelectronic devices including the microelectronic device structures (e.g., the microelectronic device structure 100) of the disclosure may exhibit increased reliability, performance, and durability relative to conventional microelectronic devices exhibiting different configurations of one or more components.

While embodiments of the disclosure may be susceptible to various modifications and alternative forms, specific embodiments have been shown by way of example in the drawings and have been described in detail herein. However, it should be understood that the disclosure is not limited to the particular forms disclosed. Rather, the disclosure encompasses all modifications, variations, combinations, and alternatives falling within the scope of the disclosure as defined by the following appended claims and their legal equivalents.

What is claimed is:

1. A method of forming a microelectronic device structure, comprising:
    coiling a portion of a wire up and around at least one sidewall of a structure protruding from another structure; and
    welding at least one interface between an upper region of the structure and an upper region of the coiled portion of the wire to form a fused region between the structure and the wire.

2. The method of claim 1, wherein coiling a portion of a wire up and around at least one sidewall of a structure comprises coiling the portion of the wire substantially completely around a lateral periphery of the structure at least one time.

3. The method of claim 1, wherein coiling a portion of a wire up and around at least one sidewall of a structure comprises coiling each of a sheathed region of the wire and an unsheathed region of the wire up and around the at least one sidewall of the structure.

4. The method of claim 3, wherein coiling each of a sheathed region of the wire and an unsheathed region of the wire up and around the at least one sidewall of the structure comprises:
    wrapping the sheathed region of the wire up and around a periphery of the structure at least one time; and wrapping the unsheathed region of the wire up and around the periphery of the structure at least one time.

5. The method of claim 1, wherein coiling a portion of a wire up and around at least one sidewall of a structure comprises directly physically contacting the at least one sidewall of the structure with the portion of the wire across an entire length of the portion of the wire.

6. The method of claim 1, further comprising selecting the wire to comprise an unplated, substantially pure metal.

7. The method of claim 1, further comprising selecting the wire to comprise an unplated metal alloy.

8. The method of claim 1, further comprising selecting an entirety of a conductive material of the wire to consist of a single, solid conductive structure.

9. The method of claim 1, wherein welding at least one interface between an upper region of the structure and an upper region of the coiled portion of the wire comprises subjecting the upper region of the structure and the upper region of the coiled portion of the wire to at least one micro welding process.

10. The method of claim 9, wherein subjecting the upper region of the structure and the upper region of the coiled portion of the wire to at least one micro welding process comprises subjecting the upper region of the structure and the upper region of the coiled portion of the wire to one or more of at least one laser welding process and at least one pulse arc welding process.

11. The method of claim 1, wherein welding at least one interface between an upper region of the structure and an upper region of the coiled portion of the wire to form a fused region between the structure and the wire comprises:
    subjecting the at least one interface to at least one initial welding process to form initial, overlapping welds along the at least one interface; and
    subjecting the initial, overlapping welds to at least one secondary welding process to form the fused region.

12. The method of claim 1, wherein welding at least one interface between an upper region of the structure and an upper region of the coiled portion of the wire to form a fused region between the structure and the wire comprises forming the fused region to be substantially homogeneous.

* * * * *

UNITED STATES PATENT AND TRADEMARK OFFICE
CERTIFICATE OF CORRECTION

PATENT NO. : 10,136,520 B2
APPLICATION NO. : 15/641057
DATED : November 20, 2018
INVENTOR(S) : Mark Hahn Page 1 of 1

It is certified that error appears in the above-identified patent and that said Letters Patent is hereby corrected as shown below:

In the Specification

| | | |
|---|---|---|
| Column 1, | Line 66, | change "of components (e,g.," to --of components (e.g.,-- |
| Column 3, | Line 59, | change "the temi "about"" to --the term "about"-- |
| Column 3, | Line 60, | change "i s inclusive of stated" to --is inclusive of the stated-- |
| Column 5, | Line 32, | change "(e.g., corrosion and" to --(e.g., corrosion), and-- |
| Column 5, | Line 33, | change "erosion, etc.) The" to --erosion, etc.). The-- |
| Column 6, | Line 26, | change "encasing, etc,) a" to --encasing, etc.), a-- |
| Column 7, | Line 36, | change "thereof In some" to --thereof. In some-- |
| Column 12, | Line 27, | change "a width thereof" to --a width thereof.-- |

Signed and Sealed this
Twenty-second Day of January, 2019

Andrei Iancu
*Director of the United States Patent and Trademark Office*